United States Patent
Balasubramaniyan

(10) Patent No.: US 6,420,923 B1
(45) Date of Patent: Jul. 16, 2002

(54) LOW SUPPLY, CURRENT-CONTROLLED FET PI ATTENUATOR

(75) Inventor: Arul Balasubramaniyan, Round Lake, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/614,311

(22) Filed: Jul. 12, 2000

(51) Int. Cl.[7] .................................................. H03L 5/00
(52) U.S. Cl. ...................................... 327/308; 327/328
(58) Field of Search ................................ 327/308, 328, 327/427, 530, 581

(56) References Cited

U.S. PATENT DOCUMENTS

| | | | | |
|---|---|---|---|---|
| 4,369,414 A | * | 1/1983 | Aoki et al. | 333/81 R |
| 4,700,153 A | | 10/1987 | Salvage et al. | 333/81 R |
| 4,975,604 A | | 12/1990 | Barta | 327/308 |
| 5,001,524 A | * | 3/1991 | Golio et al. | 333/81 R |
| 5,006,735 A | | 4/1991 | Taylor | 327/308 |
| 5,151,669 A | | 9/1992 | Roques et al. | 333/81 R |
| 5,327,072 A | * | 7/1994 | Savignac et al. | 323/313 |
| 5,410,729 A | * | 4/1995 | Kumagai et al. | 455/12.1 |
| 5,745,838 A | | 4/1998 | Tresness et al. | 725/128 |
| 5,834,983 A | | 11/1998 | Higgins, Jr. | 331/109 |
| 5,929,718 A | | 7/1999 | Crosby | 333/24 R |
| 5,969,561 A | * | 10/1999 | McGillan | 327/308 |
| 6,081,151 A | * | 7/2000 | Boulic | 327/308 |

OTHER PUBLICATIONS

Sedra et al., "Microelectronic Circuits", 1987, CBS College Publishing, Second Edition, pp. 339–342 and 352–353.*

* cited by examiner

Primary Examiner—Kenneth B. Wells
Assistant Examiner—Cassandra Cox
(74) Attorney, Agent, or Firm—Michael C. Soldner; Shigeharu Furukawa

(57) ABSTRACT

A current-controlled FET resistor and a low supply, current-controlled FET Pi attenuator network are provided. The current-controlled FET resistor includes an FET having drain, source, and gate terminals, and a connection between the gate terminal and the drain terminal, wherein a resistance characteristic of the FET is proportional to an input current flowing into the drain terminal. The low supply, current-controlled FET Pi attenuator network includes a first current-controlled FET resistor connected between an input node and a ground node, a second current-controlled FET resistor connected between the input node and an output node, a third current-controlled FET resistor connected between the output node and the ground node, a DC return path connected in parallel between the output node and the ground node, a first DC blocking capacitor connected between a Pi attenuator network input and the input node, a second DC blocking capacitor connected between the input node and the first current-controlled FET resistor, and a third DC blocking capacitor connected between the output node and the third current-controlled FET resistor, wherein resistance characteristics of the current-controlled FET resistors vary in relation to input currents flowing into the drain terminals.

7 Claims, 7 Drawing Sheets

— PRIOR ART —

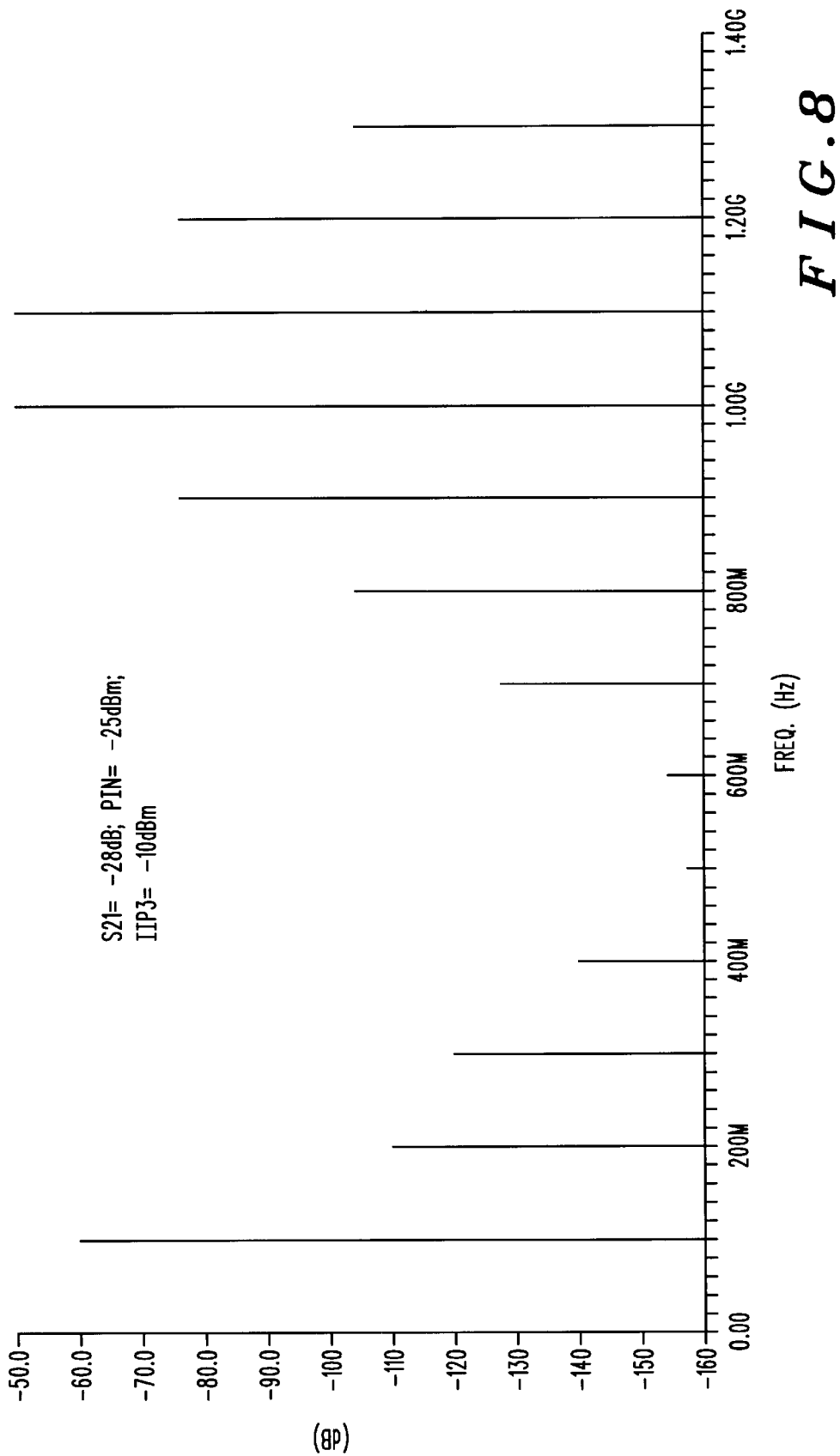

LOW SUPPLY, CURRENT-CONTROLLED FET PI ATTENUATOR

BACKGROUND OF THE INVENTION

1. Field of the Invention

The present invention relates generally to a current-controlled FET Pi attenuator, and more particularly to a current-controlled FET Pi attenuator operable under low voltage supply conditions.

2. Description of the Background Art

A signal attenuator is a device that, as the name implies, reduces the magnitude and therefore the electrical energy of an incoming waveform signal. The removed electrical energy is dissipated as heat.

Attenuation is commonly used in electrical circuits. For example, signal attenuators are commonly used in audio circuits, radio frequency (RF) circuits, automatic gain control (AGC) circuits, etc. Generally, a waveform signal is amplified to a desired maximum level and then attenuated when a lower energy level is desired. This attenuation is generally preferred because during amplification of a signal any noise on the signal is also amplified.

Attenuation of a waveform signal is somewhat more complicated than attenuation of a DC signal. A DC signal may be attenuated merely by increasing a resistance value. However, for circuits having audio or RF waveform signals, the attenuation must decrease the signal magnitude without altering or distorting the waveform, without causing phase disturbances, without affecting a signal bandwidth, etc.

FIG. 1 shows a prior art voltage-controlled field effect transistor (FET) resistor. An interesting and useful characteristic of a FET is the ability to control a current flowing through it by an applied control voltage. A voltage $V_{DS}$ applied across the drain and source terminals (with the polarity depending on whether the FET is a n-type or a p-type FET) may cause a current $I_D$ to flow through the channel region of the FET. The prior art voltage-controlled FET resistor employs a varying gate voltage bias $V_{GS}$ across the gate and source terminals of the prior art voltage-controlled FET resistor to control the flow of current $I_D$ between the drain terminal and the source terminal.

This is accomplished by using the gate voltage bias $V_{GS}$ to control the size of depletion regions inside the FET. The depletion regions are regions depleted of charge carriers where electrical current cannot flow. Controlling these depletion regions allows control of the current $I_D$ flowing between the drain and the source. When the gate voltage bias $V_{GS}$ reaches a threshold or pinch-off value $V_t$, no current can flow through the FET. The widening of the depletion regions and the corresponding narrowing of the channel therefore causes the channel resistance $r_{DS}$ to increase. Therefore, for a relatively small drain-to-source voltage bias $V_{DS}$, the FET acts as a linear resistor, with a channel resistance $r_{DS}$ being controlled by the gate voltage bias $V_{GS}$. The gate voltage bias $V_{GS}$ in the prior art voltage controlled FET resistor therefore controls the resistance of the FET.

The prior art voltage-controlled FET resistor suffers from drawbacks, however. One drawback is that the prior art voltage-controlled FET resistor suffers from a restricted control voltage range, and therefore a restricted attenuation range. A FET typically has a threshold (or turn-on) voltage $V_t$ of about 800 millivolts (mV). A typical FET will not exhibit any appreciable source-drain current unless the gate terminal is biased above the threshold voltage $V_t$. This is in contrast to a typical supply voltage of about 1.5 to 1.8 volts. These typical values give the prior art voltage-controlled FET resistor a control voltage range of no more than 800 mV (i.e., the voltage range between the threshold voltage $V_t$ and the supply voltage).

Another drawback in the prior art signal attenuator is the dependence of the control voltage on the supply voltage. The control voltage at the gate terminal changes with variations in the power supply voltage. This may make the attenuation range even more abbreviated.

What is needed, therefore, are improvements in signal attenuators operating under low power supply conditions.

BRIEF DESCRIPTION OF THE DRAWINGS

The features of the present invention which are believed to be novel are set forth with particularity in the appended claims. The invention, together with further objects and advantages thereof, may best be understood by making reference to the following description, taken in conjunction with the accompanying drawings, in the several figures of which like reference numerals identify like elements, and wherein:

FIGS. 6, 7 and 8 show changes in frequency response linearity with increasing attenuation using the FET attenuator in accordance with one aspect of the present invention.

DETAILED DESCRIPTION OF THE PREFERRED EMBODIMENTS

Figure 2:
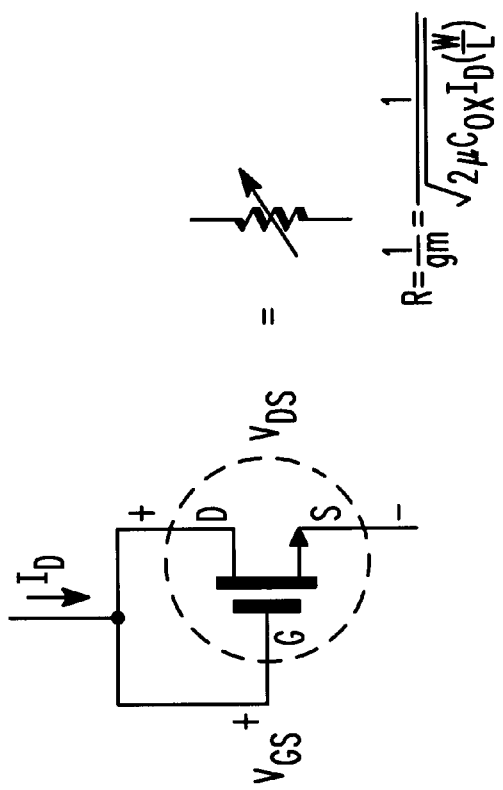
FIG. 2 shows an FET configured as a current-controlled FET resistor in accordance with one embodiment of the present invention.
Figure 1:
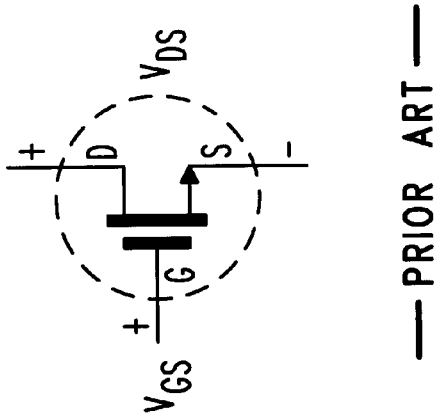
FIG. 1 shows a prior art voltage-controlled FET resistor.

FIG. 2 shows an FET configured as a current-controlled FET resistor in accordance with a preferred embodiment of the present invention. As illustrated in FIG. 2, this embodiment uses an input current $I_D$ flowing into the gate terminal to control the channel resistance $r_{DS}$ of a FET. In this FET resistor configuration, the gate terminal (labeled "G") is connected to the drain terminal (labeled "D") so that the FET is controlled by the input current $I_D$. This is sometimes referred to as a diode connected mode. The current $I_D$ may therefore be used to vary the resistance of the FET according to the formula:

$$1/R \alpha g_m \alpha [2 I_D \mu C_{OX}(W/L)]^{1/2} \qquad (1)$$

where $g_m$, is the transconductance, $\mu$ is a mobility factor of the transistor (dependent on the doping characteristics), $C_{OX}$ is an oxide layer capacitance (manufacturing process dependent), and W/L are the width and length of the depletion channel of the particular FET. The transconductance/channel resistance $r_{DS}$ may be varied somewhat by a choice of FET. Any suitable type of FET may be used, such as a JFET, MOSFET, etc. As can be seen by Equation 1, according to the present invention, a resistance characteristic of the FET is proportional to the input current $I_D$ flowing into the drain terminal, and is partially controlled by the physical size of the depletion channel W/L, the oxide layer capacitance characteristic $C_{OX}$, and the mobility factor characteristic $\mu$ of the FET.

Figure 3:
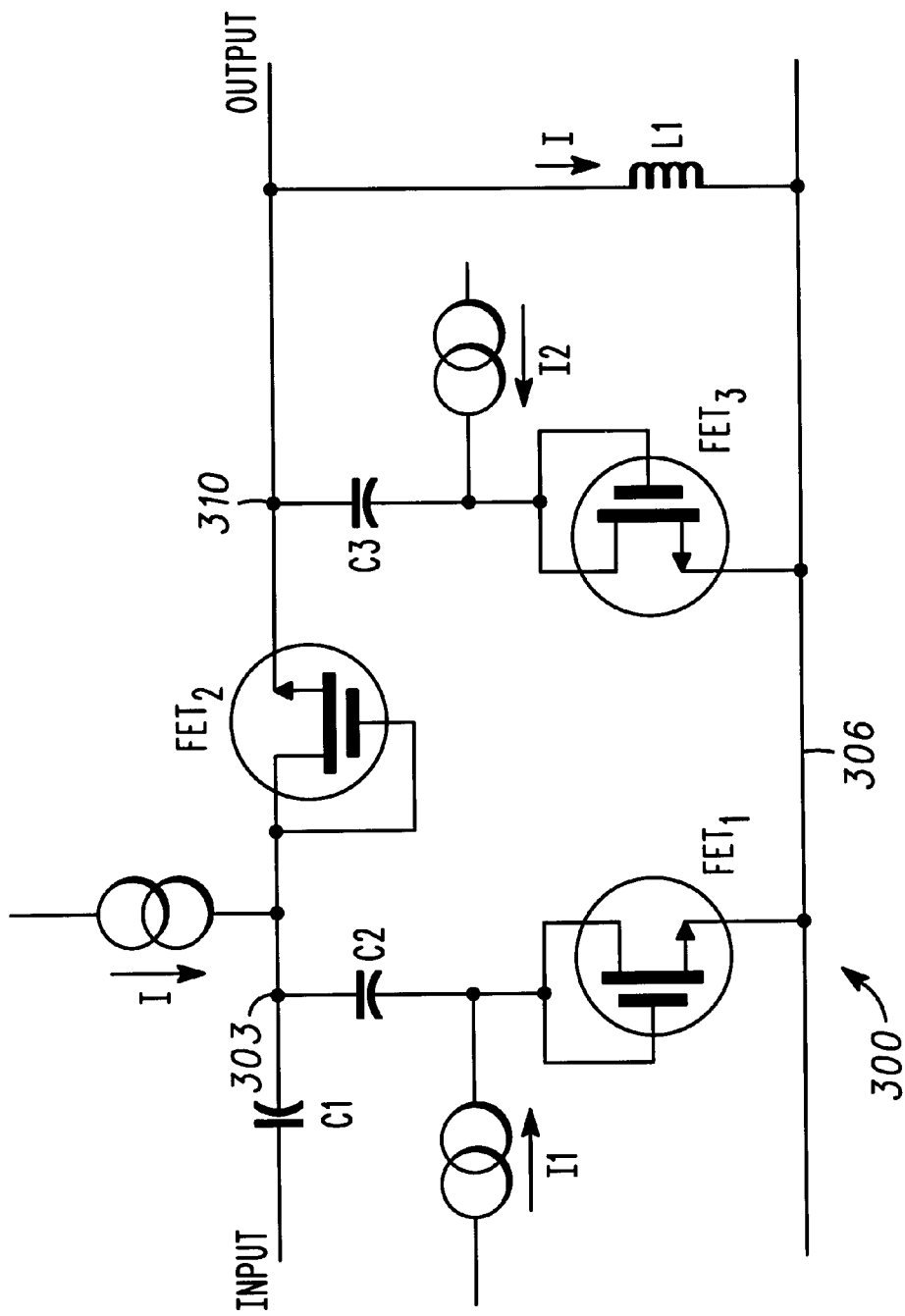
FIG. 3 shows one embodiment of a low supply, current-controlled FET Pi attenuator network in accordance with another aspect of the present invention.

FIG. 3 shows one embodiment 300 of a low supply, current-controlled FET Pi attenuator network according to the present invention. A basic Pi attenuator network is implemented having a first FET resistor $FET_1$, a second FET resistor $FET_2$, and a third FET resistor $FET_3$. At the input end a waveform signal, for example, an audio or RF signal, is input into the Pi attenuator network. At the output is an attenuated waveform, but without alteration or distortion of the input waveform.

The first FET resistor $FET_1$ is connected between an input node 303 and a reference or ground node 306. The second FET resistor $FET_2$ is connected between the input node 303 and an output node 310. It should be noted that the second FET resistor $FET_2$ may be increased in current carrying capacity by adding another similar current-controlled FET in parallel with the second FET resistor $FET_2$ (i.e., between the input node 303 and the output node 310) by which the net $V_{DS}$ could be decreased.

The third FET resistor $FET_3$ is connected between the output node 310 and the reference node 306.

Also included in the circuit are DC blocking capacitors $C_1$, $C_2$, and $C_3$. The blocking capacitor $C_1$, is connected between the Pi attenuator network input and the input node 303. The second blocking capacitor $C_2$ is connected between the input node 303 and the first FET resistor $FET_1$. The third DC blocking capacitor $C_3$ is connected between the output node 310 and the third FET resistor $FET_3$.

The function of the DC blocking capacitors is to limit the incoming current to only the desired waveform signal and not allow DC current to pass through the network. In addition, the DC blocking capacitors ensure that the currents flowing into the FET resistors are provided by the current sources I, $I_1$, and $I_2$. In a preferred embodiment, the DC blocking capacitors $C_1$, $C_2$ and $C_3$ are preferably about 1 picofarad (pf) in value, but other values may be chosen in order to obtain a desired bandwidth.

Also included in the Pi attenuator network 300 is a DC return path for the current I. In a preferred embodiment, the DC return path includes an inductor $L_1$ connected across the output node 310 and the reference node 306. The inductor $L_1$ is therefore connected in parallel with the third DC blocking capacitor $C_3$ and the third FET resistor $FET_3$. The inductor $L_1$ may be used along with the DC blocking capacitors $C_1$, $C_2$ and $C_3$ to obtain a power matching for a specific input frequency. As in the DC blocking capacitors, the inductor $L_1$ may also be chosen to obtain a desired bandwidth.

In a lesser preferred embodiment, a resistor may be substituted in place of the inductor $L_1$. While a resistor may perform the function of a DC return path, it also causes more signal loss and is therefore less desirable.

Also shown in FIG. 3 are current sources I, $I_1$, and $I_2$, with each current source being fed independently into one of the FET resistors. Current $I_1$, is fed into the drain and gate of the first FET resistor $FET_1$ and is used to control the resistance thereof. Current I is fed into the second FET resistor $FET_2$ and is used to control the resistance thereof. Current $I_2$ is fed into the third FET resistor $FET_3$ and is likewise used to control the internal resistance thereof. The three currents may therefore be used to set individual resistances of the FETs and, for the network as a whole, may set the overall attenuation.

A ratio of the current $I_1$, to the current $I_2$ may be used to provide desired input and output impedances by varying the resistance values of the first and third FET resistors $FET_1$ and $FET_3$. The FET Pi attenuator network 300 typically achieves an output impedance $Z_0$ of about 500 ohms, and could achieve an output impedance range of about 50 ohms to about 1000 ohms. The ratio of the current $I_1$, to the current $I_2$ also determines the attenuation range that may be obtained. In the diode connected mode, $V_{DS}$ never quite exceeds one volt for the range of $I_1$ or $I_2$.

Therefore, there is sufficient margin for the current sources $I_1$, and $I_2$ to operate under reduced power supply conditions (this is why the present invention performs better than the prior art). In addition, $I_1$ and $I_2$ may be adjusted to compensate for temperature variations in the circuit.

The FET Pi attenuator network 300 may be implemented with discrete components or may be fabricated as a monolithic circuit having a pair of inputs, a pair of outputs, and three current source inputs. Optionally, components such as, for example, the DC blocking capacitor $C_1$ or inductor $L_1$ may be external components that are added to a monolithic FET Pi attenuator network.

An advantage of the present invention is that a current controls the variable resistance in the circuitry and not a voltage. Therefore, changes in the power supply voltage level do not negatively impact the resistance of the circuit and do not impact the attenuation level.

A second advantage of the Pi attenuator network 300 of the present invention is that the drain-source voltage $V_{DS}$ is equal to the gate-source voltage $V_{GS}$. This avoids the threshold voltage limitation $V_t$ because $V_{DS}$ and $V_{GS}$ do not exceed one volt for the range of current applied.

Figure 4:
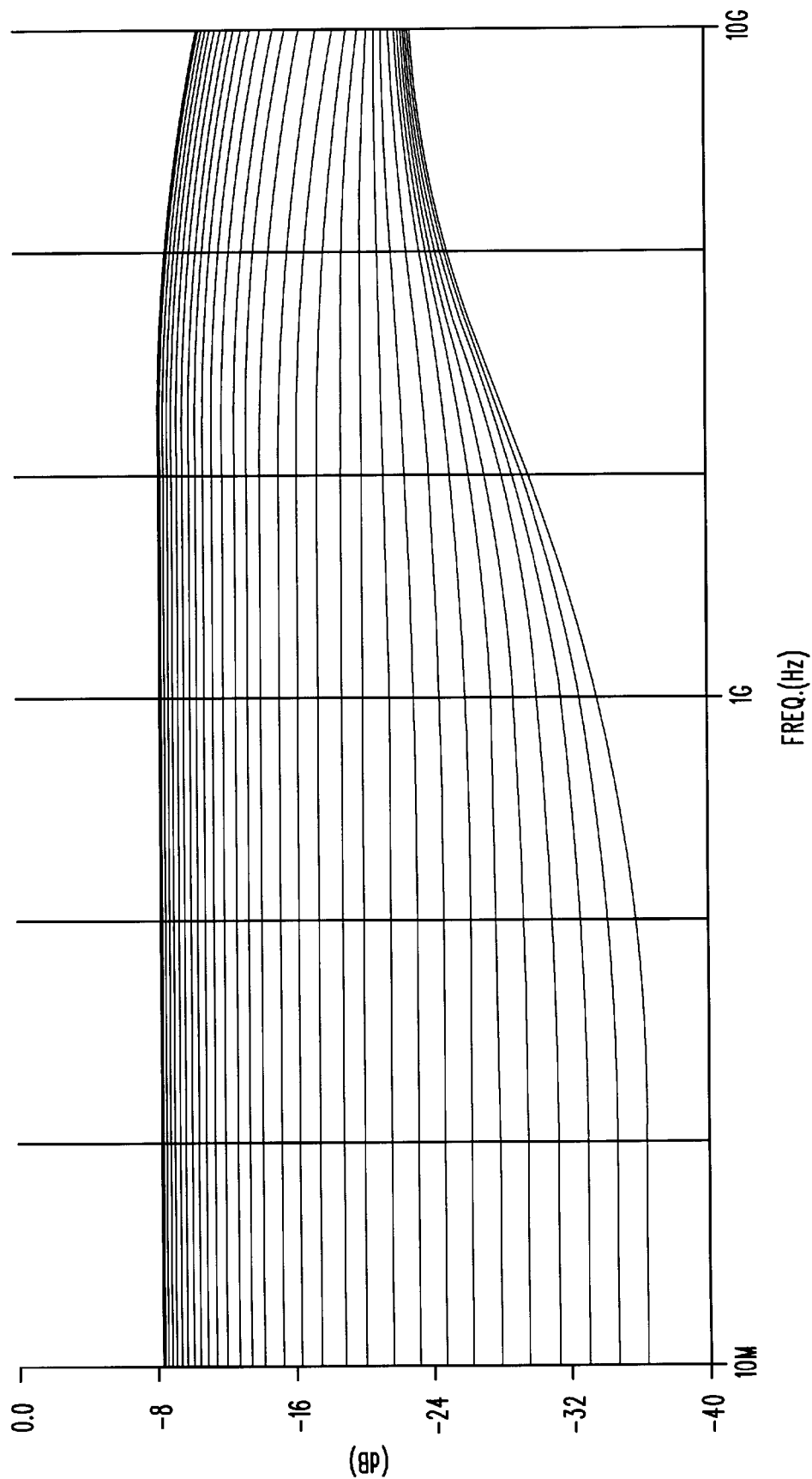
FIG. 4 shows a graph of input-to-output (S21) attenuation versus frequency response for a variety of input currents I.

FIG. 4 shows a graph of input-to-output (S21) attenuation versus frequency response for a variety of input currents I. This graph illustrates a good frequency response (a wide bandwidth of about 100 MHz to about 1000 MHz) while obtaining a desirable level of attenuation. Here, currents $I_1$, and $I_2$ were set at 400 microamps ($I_1$ and $I_2$ could be varied from microamps to milliamps, depending on device sizes), while the current I was varied from 10 microamps to 1 milliamps (I could be varied from about 10 microamps to about 10 milliamps, depending on device sizes). This yields an attenuation range of about 30 dB for a bandwidth up to about 1 gigahertz (GHz). It can be seen that the bandwidth is somewhat limited at higher frequencies. This is due to the gate-source capacitance $C_{GS}$.

Figure 5:
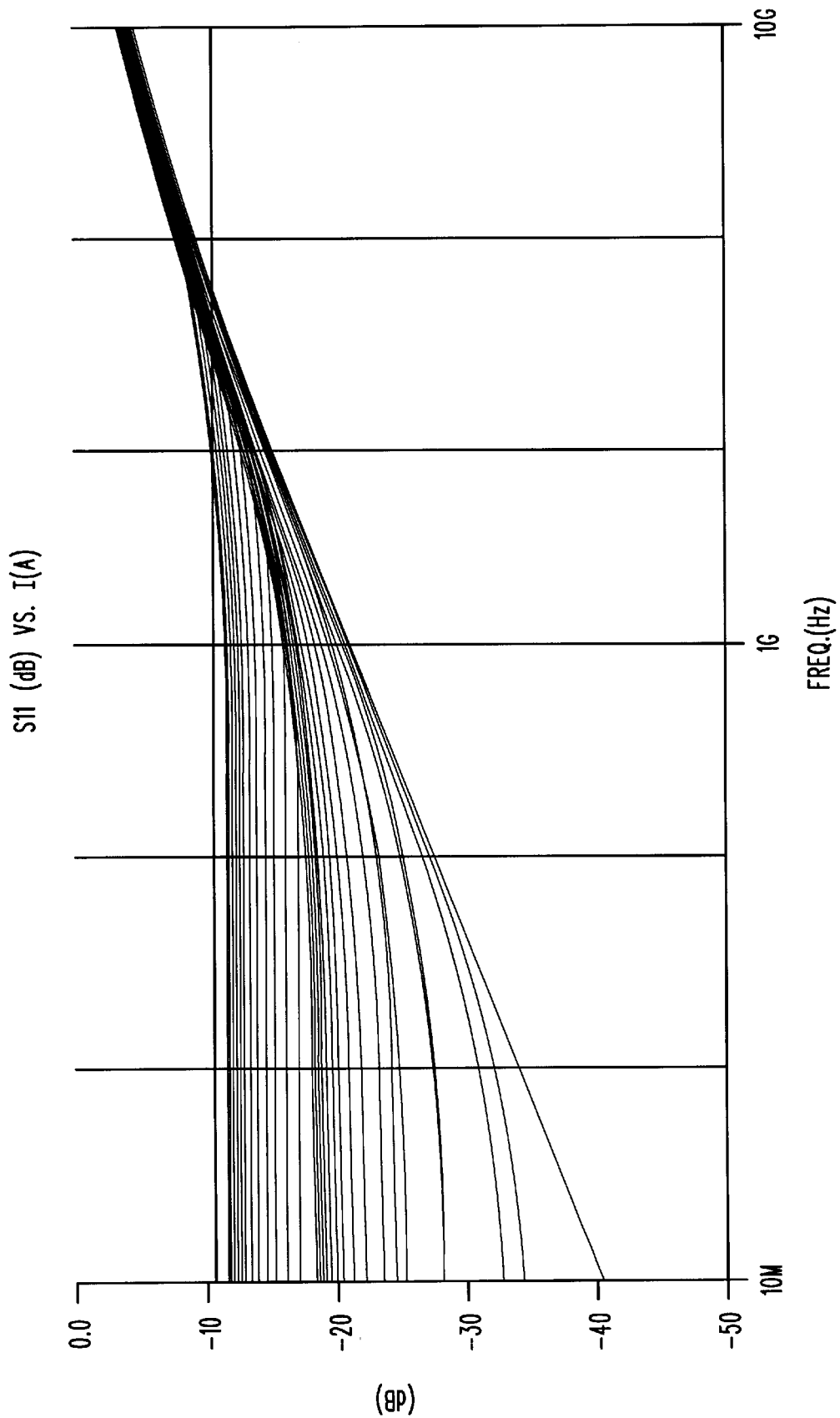
FIG. 5 shows a graph of reflected (S11) attenuation versus frequency response for a variety of input currents I.

FIG. 5 shows a graph of reflected (S11) attenuation versus frequency response for a variety of input currents I. A better than 10 dB return loss is obtained at both the inputs and the outputs of the attenuator network using fixed control currents $I_1$ and $I_2$ of about 400 milliamps.

Figure 6:
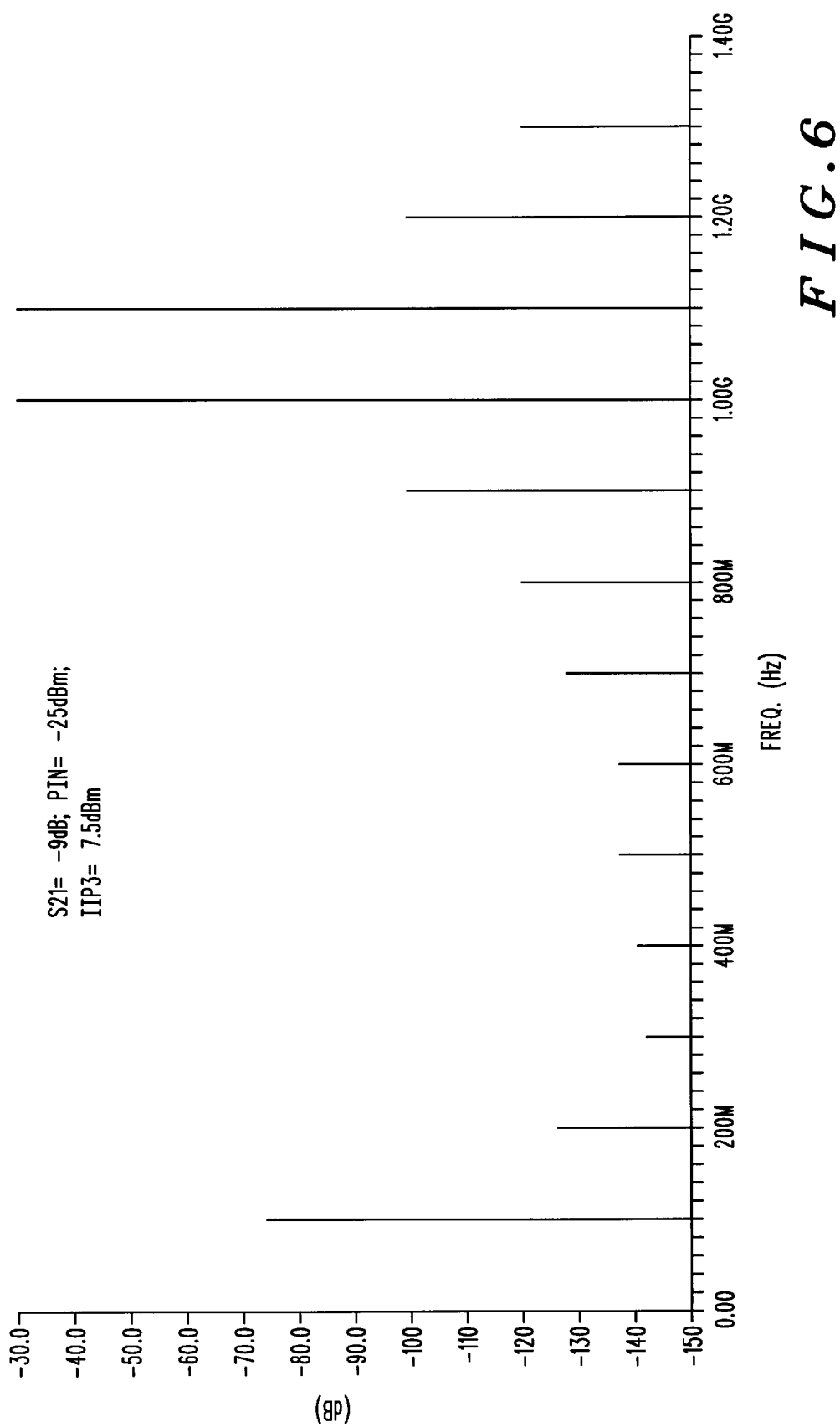
Figure 7:
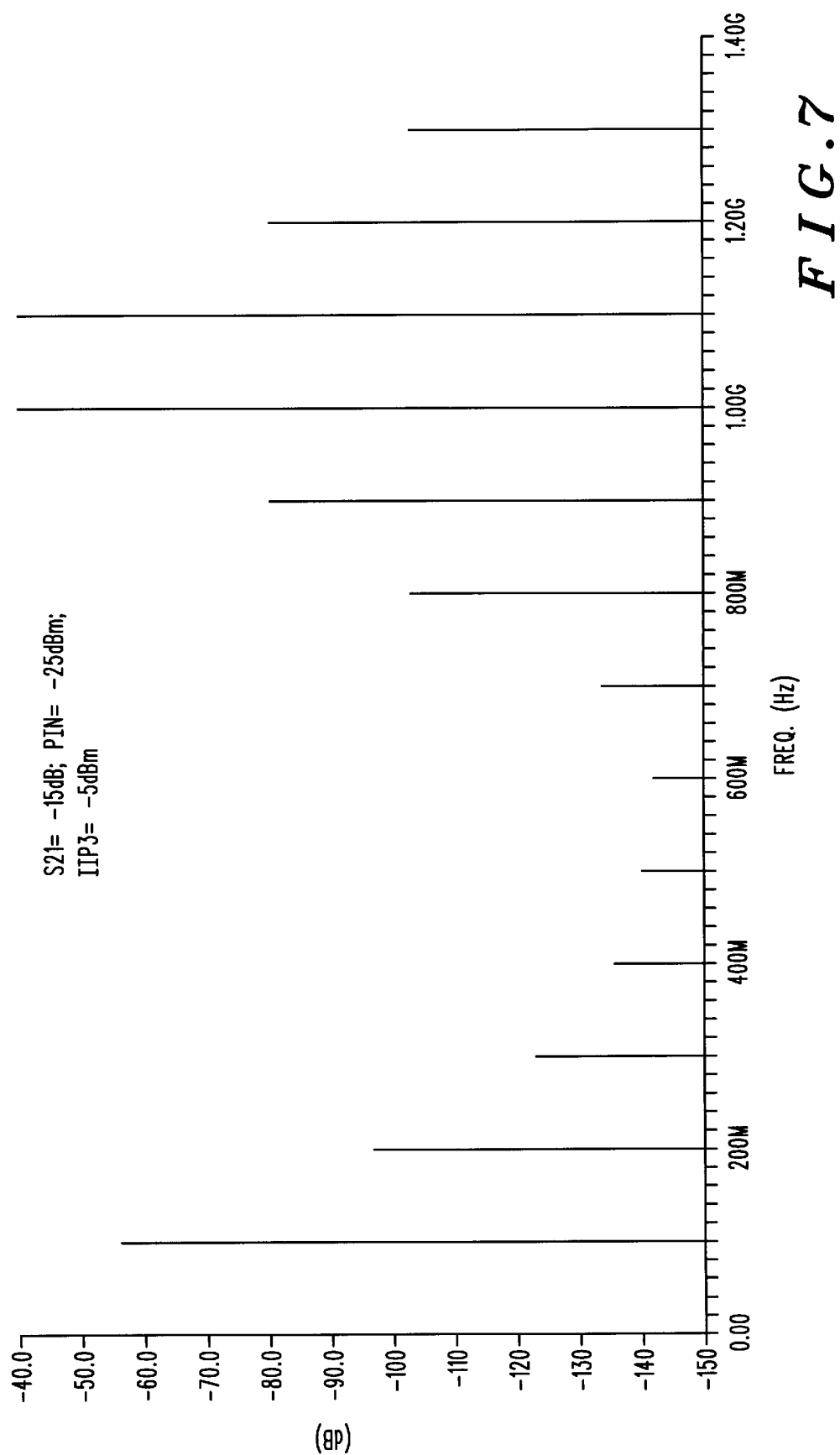

FIGS. 6, 7 and 8 show $I_m$ (intermodulation) performance of the attenuator for low, medium, and high attenuation conditions, in accordance with one aspect of the present invention. The attenuation level is at a low level in FIG. 6, is increased in FIG. 7, and reaches an even higher level in FIG. 8. It can be seen from these graphs that as the attenuation level increases, the $I_m$ performance degrades.

While the invention has been described in detail above, the invention is not intended to be limited to the specific embodiments as described. It is evident that those skilled in the art may now make numerous uses and modifications of and departures from the specific embodiments described herein without departing from the inventive concepts.

What is claimed is:

1. A low supply, current-controlled FET Pi attenuator network, comprising:

a first current-controlled FET resistor connected between an input node and a ground node and having a gate terminal connected to a drain terminal;

a second current-controlled FET resistor connected between said input node and an output node and having a gate terminal connected to a drain terminal;

a third current-controlled FET resistor connected between said output node and said ground node and having a gate terminal connected to a drain terminal;

a DC return path connected between said output node and said ground node, with said DC return path being connected in parallel with said third current-controlled FET resistor;

a first DC blocking capacitor connected between a Pi attenuator network input and said input node;

a second DC blocking capacitor connected between said input node and said first current-controlled FET resistor; and a third DC blocking capacitor connected between said output node and said third current-controlled FET resistor;

wherein resistance characteristics of said first, second, and third current-controlled FET resistors vary in relation to input currents flowing into said drain terminal of said first, second, and third current-controlled FET resistors.

2. The low supply, current-controlled FET Pi attenuator network of claim 1, wherein said DC return path comprises an inductor.

3. The low Supply, current-controlled FET Pi attenuator network of claim 1, wherein said DC return path comprises a resistor.

4. The low supply, current-controlled FET Pi attenuator network of claim 1, wherein each current-controlled FET resistor receives an independent current supply.

5. The low supply, current-controlled FET Pi attenuator network of claim 1, wherein said resistance characteristic is partially controlled by a physical size of a channel region of said FET.

6. The low supply, current-controlled FET Pi attenuator network of claim 1, wherein said resistance characteristic is partially controlled by an oxide layer capacitance characteristic of said FET.

7. The low supply, current-controlled FET Pi attenuator network of claim 1, wherein said resistance characteristic is partially controlled by a mobility factor characteristic of said FET.

* * * * *